(12) United States Patent
Rivnay

(10) Patent No.: US 10,694,635 B1
(45) Date of Patent: Jun. 23, 2020

(54) MESH NETWORK TOPOLOGY BASED ON MIDPLANE BOARD

(71) Applicant: Amazon Technologies, Inc., Seattle, WA (US)

(72) Inventor: Roey Rivnay, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/103,653

(22) Filed: Aug. 14, 2018

(51) Int. Cl.
 *H05K 7/14* (2006.01)
(52) U.S. Cl.
 CPC ......... *H05K 7/1491* (2013.01); *H05K 7/1445* (2013.01); *H05K 7/1451* (2013.01); *H05K 7/1487* (2013.01); *H05K 7/1489* (2013.01); *H05K 7/1492* (2013.01)
(58) Field of Classification Search
 CPC .. H05K 7/1491; H05K 7/1487; H05K 7/1445; H05K 7/1451; H05K 7/1492; H05K 7/1489
 See application file for complete search history.

(56) References Cited

U.S. PATENT DOCUMENTS

| | | | | |
|---|---|---|---|---|
| 6,826,456 B1 * | 11/2004 | Irving | ....................... | G06F 1/20 361/695 |
| 10,028,403 B1 * | 7/2018 | Hartman | ................. | H05K 7/142 |
| 10,146,271 B1 * | 12/2018 | Pav | ....................... | H05K 7/1487 |
| 2002/0081890 A1 * | 6/2002 | Obermaier | ........... | H05K 7/1451 439/377 |
| 2012/0236521 A1 * | 9/2012 | Tamura | .................. | H01R 12/71 361/756 |
| 2015/0036272 A1 * | 2/2015 | Tachibana | ............... | G06F 1/189 361/679.4 |
| 2017/0150621 A1 * | 5/2017 | Breakstone | ......... | G06F 13/4022 |

* cited by examiner

*Primary Examiner* — Daniel P Wicklund
*Assistant Examiner* — Sagar Shrestha
(74) *Attorney, Agent, or Firm* — Kilpatrick Townsend & Stockton LLP

(57) ABSTRACT

A system can include a midplane board and multiple sleds. Each sled can include a processor and an interconnect part. The interconnect part can be positioned at a lateral edge of the sled. Both sides of the midplane board can include interconnect portions that engage the interconnect parts from the sleds. The interconnect portions of the midplane board can be connected to enable inter-processor communication among processors on the sleds. For example, the midplane board may connect processors from first and second sleds received on one side of the midplane board with processors from third and fourth sleds received on an opposite side of the midplane board. The sleds may connect to power at rear, for example, being translated in a longitudinal direction to engage power and translated toward the midplane board and non-parallel to the longitudinal direction to engage the interconnect parts and portions.

20 Claims, 4 Drawing Sheets

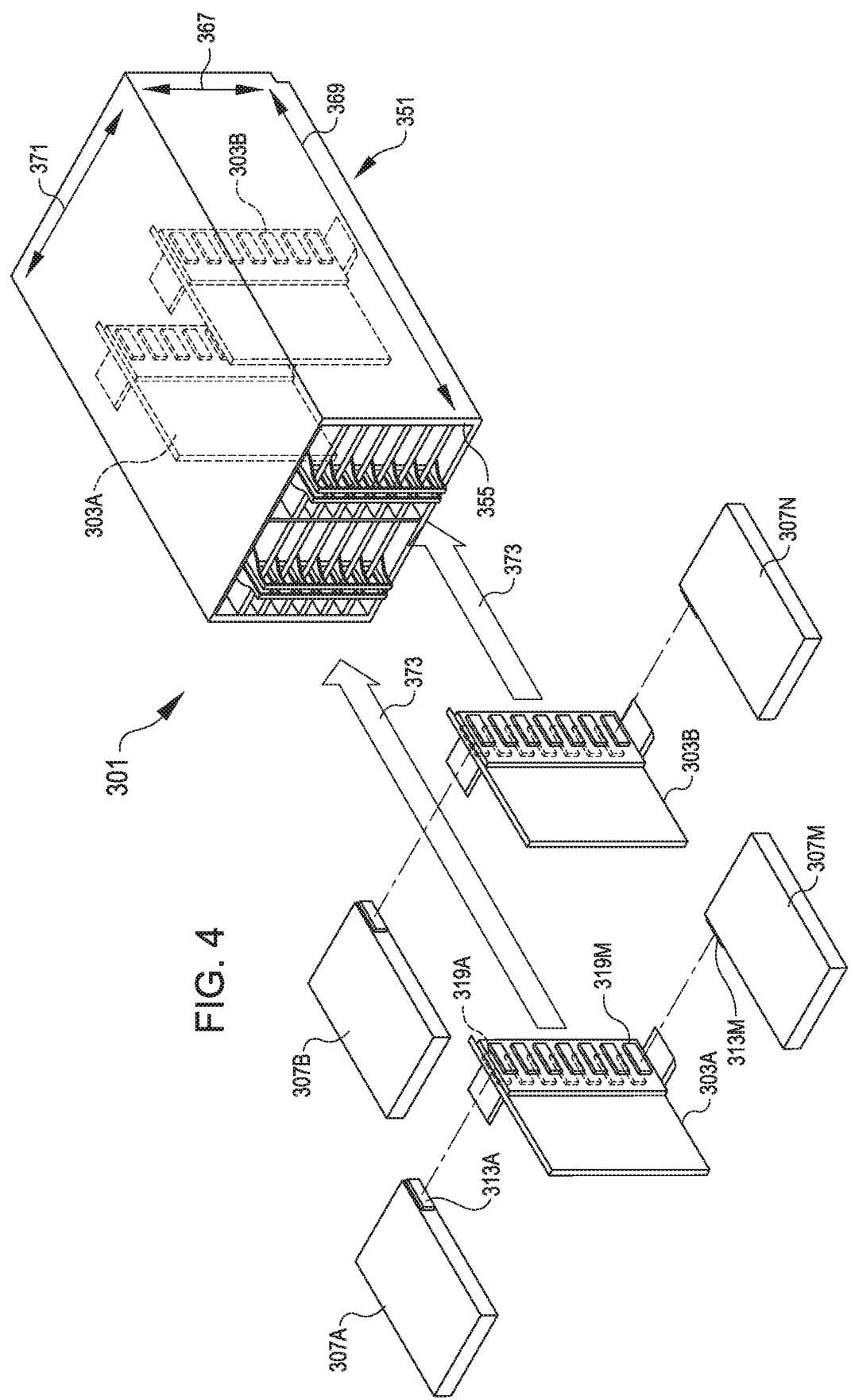

MESH NETWORK TOPOLOGY BASED ON MIDPLANE BOARD

BACKGROUND

Many computer network architectures feature processors interconnected across different locations to enable inter-processor communication and access to different memory assets. Often, boards with multiple processors apiece are connected within multimode systems by cables, which facilitate flexibility to select a manner of connection and achieve a given topology desired for a network according to the intended function of the network.

However, such cabled arrangements are subject to various limitations. For example, design guidelines for cabled arrangements typically impose limitations on individual and/or total distances that electrical signals will need to travel through the cable or through structure coupled with the cable based on known degradation of the electrical signals beyond such distances. Although in some cases, including repeaters or other active components may mitigate such signal degradation, including such additional components can add undesirable complexity and cost to the network architecture. Overall, length of total and/or subparts of links between processors remains an important consideration for mesh topology of networks.

BRIEF DESCRIPTION OF THE DRAWINGS

Various embodiments in accordance with the present disclosure will be described with reference to the drawings, in which:

FIG. 4 illustrates another example of an implementation of components of FIG. 1 relative to a server rack chassis according to some embodiments of the present disclosure.

DETAILED DESCRIPTION

Figure 1:
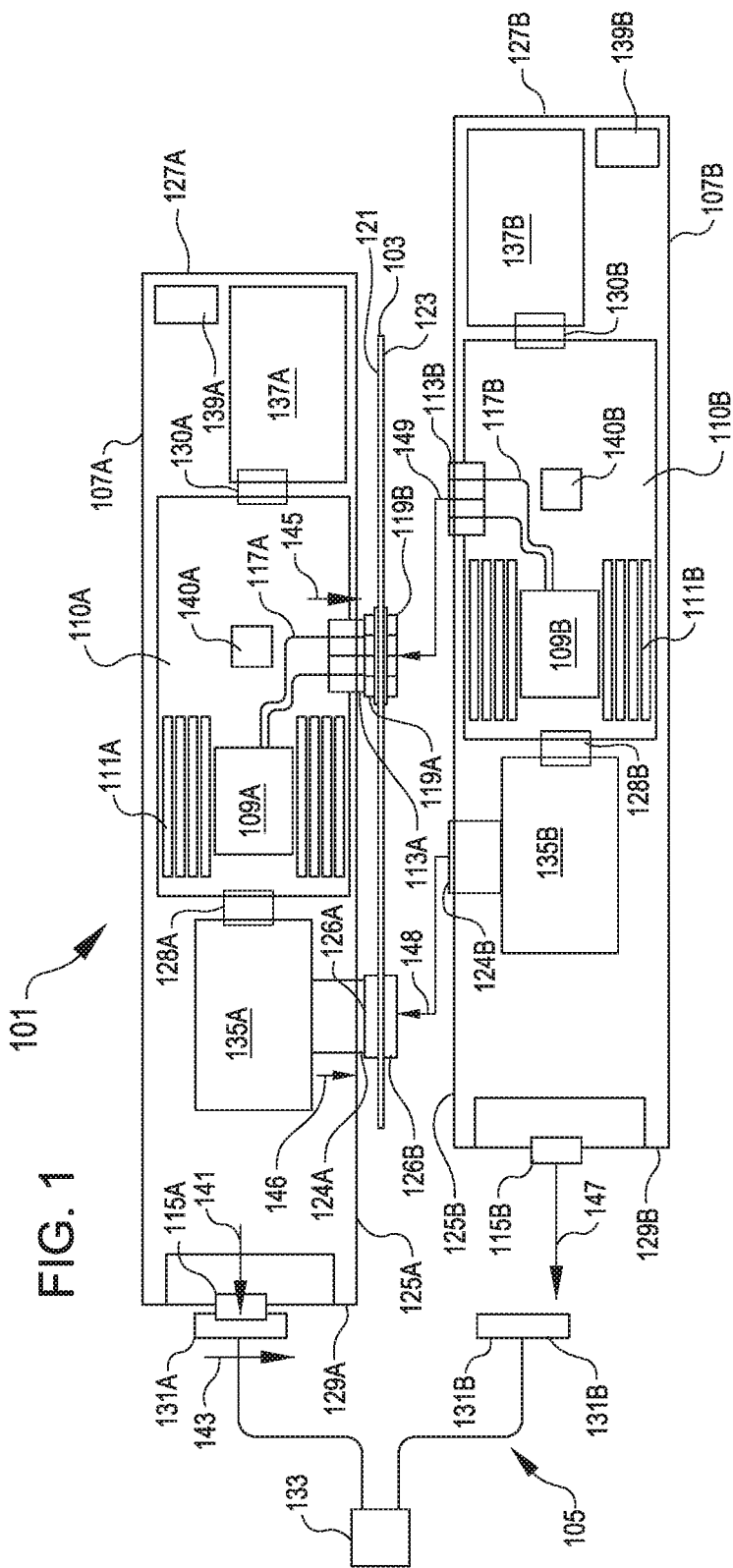
FIG. 1 illustrates an arrangement of compute sleds in different states of engagement relative to a midplane board and a power harness according to some embodiments of the present disclosure.

Embodiments herein are directed to components for forming a mesh computer network architecture. Compute sleds can be received by a midplane board, which can provide connections to link processors on different sleds and enable inter-processor communication, such as for a mesh network topology. In at least some cases, the compute sleds and the midplane board form a network within a single chassis.

The midplane board may be a passive board without active components. Such a construction may link respective processors with a structure that may be more cost efficient than arrangements that rely on cables and/or active components such as repeaters to mitigate signal degradation. In some embodiments, using the midplane board may obviate the need for cables.

Interconnect interfaces may be utilized to connect sleds to the midplane board. Non-limiting examples of possible types for the interconnect interfaces can include Ultra path Interconnect (UPI), peripheral component interconnect express (PCIE), and/or other interconnect interfaces utilized for connecting respective boards within computing contexts.

The interconnect portion on the sled may be positioned along a lateral edge of the sled (e.g. approximately at the middle of the sled). Such lateral edge positioning of the interconnect on the sled may result in a much shorter link between the processor and the interconnect than if the interconnect were instead located at the front or rear of the sled (e.g. due to the width of the sled typically being much shorter than the length of the sled). In an illustrative example, the sled might be dimensioned such that the link length from the processor to the interconnect would be less than 6 inches when the interconnect is arranged on the lateral edge but would be over 15 inches if the interconnect were arranged on the front.

The midplane board may be arranged in different orientations, e.g., relative to a chassis of a server rack. In some embodiments, the midplane board may be arranged horizontally within the chassis. For example, the midplane board may receive sleds from above and/or below. In other embodiments, the midplane board may be arranged vertically within the chassis. For example, the midplane board may receive sleds from left and/or right of the midplane board.

The midplane board may receive sleds on opposite sides of the midplane board. For example, the midplane board may receive one or more sleds on a top side and one or more other sleds on a bottom side or receive one or more sleds on a left side and one or more other sleds on a right side. Receiving sleds on opposite sides of the midplane board may allow for shorter lengths of links between processors on sleds than if all sleds were constrained to be received on a single side of the board. For example, whereas a first interconnect element on the midplane board might have respective link lengths of 2 inches, 4 inches, and 6 inches to the nearest interconnect elements s if all were arranged in series on a single side of the midplane board, the first interconnect element when the midplane board receives on both sides might instead have respective link lengths of approximately 2 inches to an adjacent, second interconnect element on the same side of midplane board, approximately 0.1 inches to a third interconnect element opposite the first interconnect element (e.g., which might result from an example midplane board thickness of 0.1 inches), and approximately 2.1 inches to a fourth interconnect element opposite the second interconnect element (e.g., amounting to the 2 inches to the second interconnect plus an additional 0.1 inches corresponding to the example 0.1 inches thickness of the midplane board).

The sleds may each be single socket boards that include a single processor each. This may permit servicing in which an individual sled can be removed for servicing and only affect the individual processor on that sled, in contrast to two-socket boards or four-socket boards that respectively could be expected to also affect the additional one or three processors further borne on the sled when the sled is removed. However, embodiments herein are not limited to single socket boards, and some benefits described herein may be obtained regardless of whether single socket or multi-socket sleds are utilized.

The sleds may engage separate power connectors distinct from the interconnects. The power connectors may be arranged by a power harness so as to be oriented along a different plane than the midplane board (e.g., perpendicular to the midplane board). In operation, the sleds may be subject to multiple motions to achieve installation. For example, the sleds may be inserted and translated along the longitudinal direction of a chassis to engage the power connectors. The sleds may be subjected to a second motion of translating in a different direction towards the midplane board to bring the sleds into engagement with the midplane board (e.g., to cause engagement of interconnects). For example, the different direction may be up or down if the midplane is oriented horizontally or leftward or rightward if the midplane is oriented vertically. The power connectors may be appropriately featured to permit connection between the power connectors and the sleds to be maintained as the sleds are translated toward the midplane board for engagement of the interconnects.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Reference will now be made to the Figures, in which like reference numerals refer to like elements throughout the Figures. In many instances, similar elements may be identified by the same reference numeral and differentiated by a different letter suffix in the Figures. Thus in the following text description, elements may be referenced with suffixes (e.g., for referencing individual or specific elements such as a first compute sled 107A or a second compute sled 107B) or without suffixes (e.g., for generally or collectively referencing elements such as one or more of the compute sleds 107).

FIG. 1 illustrates a system 101 according to certain embodiments. In FIG. 1, the system 101 includes a midplane board 103, a power harness 105, and compute sleds 107 (e.g., individually identified as a first compute sled 107A and a second compute sled 107B).

The first compute sled 107A is depicted in FIG. 1 with a processor 109A, memory assets 111A, an interconnect part 113A, a power connector part 115A, and an adaptor part 124A. The processor 109A can access the memory assets 111A for read and/or write purposes as warranted for operation in computing functions. The processor 109A may be connected to the interconnect part 113A by a suitable link 117A. In some embodiments, the link 117A can be or include a trace within a printed circuit board 110A, e.g., which may be a circuit board 110A to which various or all of the components of the first compute sled 107A are coupled. The link 117A and/or interconnect part 113A may correspond to a structure (e.g., a connector or interface) configured to facilitate inter-processor communication between the processor 109A and other features that may be located apart from the compute sled 107A. Non-limiting examples include Ultra path Interconnect (UPI), peripheral component interconnect express (PCIE), and other interfaces utilized for connecting within computing contexts.

The adaptor part 124A can be coupled with a component other than the processor 109A to facilitate communication with the component. For example, the adaptor part 124A in FIG. 1 is shown coupled with an expansion card 135A. The adaptor part 124A may facilitate communication that may be independent of the processor 109A and/or the interconnect part 113. Notwithstanding this possibility, in some embodiments, the adaptor part 124A may facilitate communication to or from the processor 109A, such as through intervening components. For example, in FIG. 1, the expansion card 135A may be coupled with the processor 109A through an interface 128A, e.g., which may permit communication between the processor 109A and the adaptor part 126A via the interface 128A and the expansion card 135A.

More generally, the adaptor part 124A and the interconnect part 113A may each be respective connectors for the first compute sled 107A. Thus, in FIG. 1, the first compute sled 107A is depicted specifically with two connectors, of which a first of the two (e.g., the interconnect part 113A) is coupled with the processor 109A and a second of the two (e.g., the adaptor part 124A) is coupled with a different component (e.g., the expansion card 135A) that is different from the processor 109A. However, other arrangements are also possible. For example, the sled 109A can include any suitable number of connectors (including, but not limited to one, two, or more than two), which may be respectively coupled to respective corresponding components that may be different from one another. In some embodiments, within a set of connectors, multiple connectors may be of a same type (e.g., the adaptor part 124A and the interconnect part 113A could both be a UPI type or both be a PCIE type). Additionally or alternatively, in some embodiments, within a set of connectors, multiple connectors may be of different types (e.g., the interconnect part 113A may be a UPI type and the adaptor part 124A may be a PCIE type, or the interconnect part 113A may be a PCIE type and the adaptor part 124A may be a UPI type).

The second compute sled 107B is depicted in FIG. 1 with similar components to those identified for the first compute sled 107A.

The interconnect parts 113 of the compute sleds 107 can include suitable structure for mating with interconnect portions 119 of the midplane board 103. In some embodiments, the interconnect parts 113 of the compute sleds 107 include interconnect projections, while the interconnect portions 119 of the midplane board 103 include interconnect slots or recesses that can receive the interconnect projections. For example, the interconnect parts 113 of the compute sleds 107 may correspond to a structure available under the trade name Amphenol/AFCI Xcede or some other interface having a high density of high-speed rated pins for data links along with one or more alignment pins to ensure proper mating within slots and/or recesses forming the interconnect portions 119 of the midplane board 103. More generally, the interconnect parts 113 of the compute sleds 107 and the interconnect portions 119 of the midplane board 103 can join together in respective pairs to form an interconnect interface, e.g., regardless of whether slots and projections are respectively located on the midplane board 103 or on the compute sleds 107. The interconnect interface formed by the interconnect parts 113 of the compute sleds 107 engaging with the interconnect portions 119 of the midplane board 103 can allow communication between the respective compute sleds 107 and the midplane board 103. Similarly, the adaptor parts 124 on the compute sleds 107 can include suitable structure for mating with adaptor portions 126 of the midplane board 103, e.g., so that adaptor parts 124 of the compute sleds 107 and the adaptor portions 126 of the midplane board 103 can join together in respective pairs to form an adaptor interface, such as to allow communication between the respective compute sleds 107 and the midplane board 103.

Respective interconnect portions 119 of the midplane board 103 can be linked to one another to permit communication between the respective interconnect portions 119 of the midplane board 103. For example, the first interconnect portion 119A can be connected by a trace or other suitable link to the second interconnect portion 119B to permit communication therebetween. Although only two interconnect portions 119 on opposite sides of the midplane board 103 are visible in FIG. 1, the midplane board 103 may include and link together more interconnect portions 119, including, but not limited to, interconnect portions 119 that may be positioned into or out of the page on the midplane board 103 in FIG. 1. Similarly, respective adaptor portions 126 of the midplane board 103 can be linked to one another to permit communication between the respective adaptor portions 126 of the midplane board 103, such as by traces or other suitable links between the depicted adaptor portions 126 and/or any others that may be positioned into or out of the page in FIG. 1.

As a result of suitable linking between respective interconnect portions 119 of the midplane board 103, the midplane board 103 can provide communication between respective sleds 107 coupled with the midplane board 103. For example, when both the first sled 107A and the second sled 107B are coupled with the midplane board 103, the first processor 109A may be able to send and/or receive signals to the second processor 109B, such as through a topology that includes the first link 117A, the first interconnect part 113A, the first interconnect portion 119A, the midplane board 103, the second interconnect portion 119B, the second interconnect part 113B, and the second link 117B. Enabling inter-processor communication through the midplane board 103 may allow memory assets 111A of the first processor 109A to be accessed and/or otherwise utilized by the second processor 109B, and/or permit memory assets 111B of the second processor 109B to be accessed and/or otherwise utilized by the first processor 109A. Inter-processor communication enabled by the midplane board 103 may be particularly useful in forming mesh network topologies.

Similarly, as a result of suitable linking between respective adaptor portions 126 of the midplane board 103, the midplane board 103 can provide other modes of communication between respective sleds 107 coupled with the midplane board 103. In some embodiments, the midplane board 103 may provide communication that may be independent of the processors 109. For example, when both the first sled 107A and the second sled 107B are coupled with the midplane board 103, the first rearward expansion card 135A may be able to send and/or receive signals to the second rearward expansion card 135B, such as through a topology that includes the first adaptor part 124A, the first adaptor portion 126A the midplane board 103, the second adaptor portion 126B, and the second adaptor part 124B. In some embodiments, the midplane board 103 may provide communication between a processor 109 on one sled 107 and a non-processor component on another sled 107 (such as an expansion card 135 or 137). For example, when both the first sled 107A and the second sled 107B are coupled with the midplane board 103, the first rearward expansion card 135A may be able to send and/or receive signals to the second processor 109B, such as through a topology that includes the first adaptor part 124A, the first adaptor portion 126A the midplane board 103, the second adaptor portion 126B, the second adaptor part 124B, the second expansion card 135B, and the interface 128B, or alternatively, such as through a topology that includes the interface 128A, the first processor 109A the first link 117A, the first interconnect part 113A, the first interconnect portion 119A, the midplane board 103, the second interconnect portion 119B, the second interconnect part 113B, and the second link 117B. Other topologies or routes can also be achieved, including but not limited to communication relative to forward expansion cards 137A and 137B via intervening components depicted and/or via additional interconnecting structure on the sleds 107 and midplane board 107 if included.

The midplane board 103 can engage connectors on opposite sides of the midplane board 103. For example, in FIG. 1, the first interconnect portion 119A is shown on a first side 121 of the midplane board 103, while the second interconnect portion 119B is shown on a second side 123 of the midplane board 103. As another example, in FIG. 1, the first adaptor portion 126A is shown on the first side 121 of the midplane board 103, while the second adaptor portion 126B is shown on the second side 123 of the midplane board 103. Use of both sides of the midplane board 103 for engaging respective sleds 107 may increase a density of sleds 107 that can be accommodated.

Connectors may be positioned on lateral edges 125 of the compute sleds 107. For example, in FIG. 1, the first interconnect part 113A is depicted positioned on a first lateral edge 125A of the first compute sled 107A. Placement of the interconnect part 113A at, adjacent, or along the lateral edge 125A may result in a significantly shorter length of the link 117A between the processor 109A and the interconnect part 113A than if the interconnect part 113A were instead positioned at, adjacent, or along a front 127A or a rear 129A of the sled 107A. In some embodiments, the length of the link 117A may be less than 6 inches, which may contrast with a distance of at least 15 inches that might be present if the interconnect part were instead disposed at the front 127A of the sled 107A.

In some embodiments, placement of connectors at the lateral edge 125A of the compute sled 107A can avoid encroaching or occupying space that might otherwise be utilized to accommodate other components on the compute sled 107A, such as a rearward expansion card 135A, a forward expansion card 137A (e.g., which may be connected for communication via a suitable interface 130A), a front panel interface 139A, and/or other chips or features 140A that might otherwise be useful to include on the compute sled 107A or that might otherwise be present in an initial design for the compute sled 107A that might be modifiable to include placement of the interconnect part 113A at the lateral edge 125A. Because placement of the interconnect part 113A (or other connector such as adaptor part 124A) at the lateral edge 125A can utilize less space than placement at the front 127A or rear 129A of the compute sled 107A, the placement of the interconnect part 113A (or other connector such as adaptor part 124A) at the lateral edge 125A can allow placement of other components to be more easily maintained or achieved.

The power harness 105 in FIG. 1 includes respective power connector portions 131A and 131B. The power connector portions 131 can be respectively coupled with a power source 133. For example, the power source 133 may correspond to a power supply or other source capable of providing power to components coupled with the power connector portions 131. The power connector portions 131 can include suitable structure to mate with the power connector parts 115 of the compute sleds 107. For example, in some embodiments, the power connector parts 115 of the compute sleds 107 include projections, while the power connector portions 131 of the power harness 105 include slots that can receive the projections. More generally, the power connector portions 131 of the power harness 105 and the power connector parts 115 of the compute sleds 107 can join together in respective pairs to form a power connection interface. The power harness 105 can include any suitable structure to maintain the power connector portions 131 appropriately positioned for engaging the power connector parts 115 of the compute sleds 107. For example, in some embodiments, the power connector portions 131 may include hardware or other features to facilitate panel mounting, such as along a panel, board, or other structure arranged at a rear or other location within a server chassis and/or oriented non-parallel to the midplane board 105.

In use, a respective sled 107 can be installed to engage both the power harness 105 and the midplane board 103. For example, in FIG. 1, arrow 147 (toward the leftward direction in FIG. 1) illustrates that the sled 107B can be installed so that its power connector part 115B will engage a power connector portion 131B of the power harness 105. Another arrow 149 illustrates that the sled 107B can be moved so that its interconnect part 113B (if present) can engage an interconnect portion 119B of the midplane board 103. Similarly, a further arrow 148 illustrates that the sled 107B can be moved so that its adaptor part 124B (if present) additionally or alternatively can engage an adaptor portion 126B of the midplane board 103.

The installation of a respective sled 107 may involve multiple motions. For example, in FIG. 1, the sled 107A is shown fully installed. The sled 107A may arrive at the depicted position by a first motion and a second motion. The first motion may include translating the sled 107A toward the power harness 105, e.g., as illustrated by arrow 141. The first motion illustrated by arrow 141 may cause the power connector part 115 on the sled 107A to engage the power connector portion 131A on the power harness 105. The second motion may include translating the sled 107A in a different, non-parallel direction and toward the midplane board 103, e.g., as illustrated by the arrows 143, 145, and 146. As illustrated by arrow 145, the second motion may cause the interconnect part 113A of the sled 107A to engage the first interconnect portion 119A on the midplane board 103. As illustrated by arrow 146, the second motion may cause the adaptor part 124A of the sled 107A to engage the first adaptor portion 126A on the midplane board 103. As illustrated by arrow 143, the second motion may cause the power connector part 115A on the sled 107A to shift along the power harness 105. The power harness 105 and/or sled 107A may include suitable structure to maintain engagement between the power connector part 115A on the sled 107A and the power connector portion 131A on the power harness 105. Non-limiting examples may include a track on which the power connector portion 131A on the power harness 105 can travel, a track on which the power connector part 115A on the sled 107A can travel, a slot that is longer than a projection so that the projection when received can travel within the slot and maintain contact, or any other suitable structure to maintain connection for power transfer between two parts in which at least one is movable.

Figure 2:
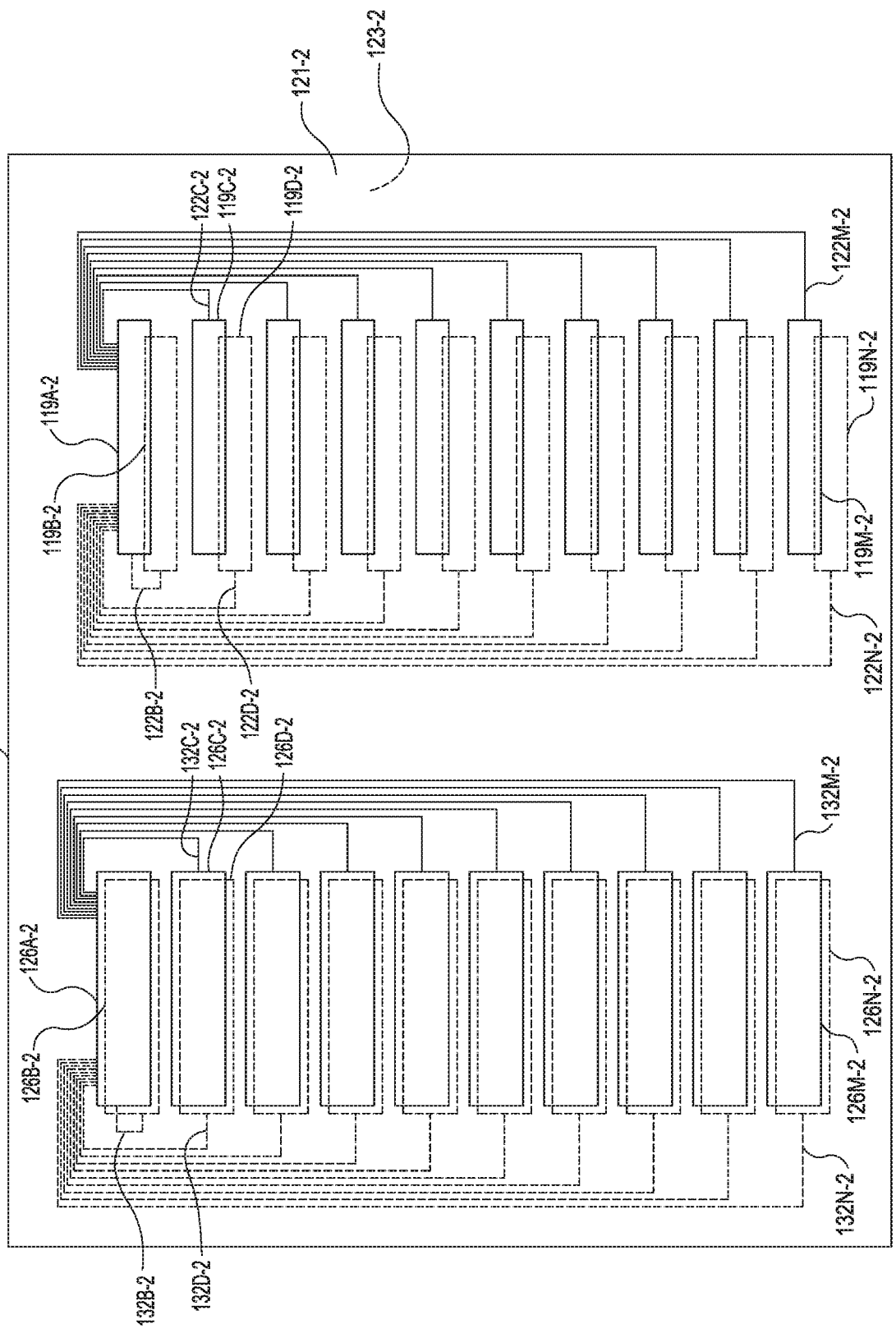
FIG. 2 illustrates a plan view of an example of a midplane board that may be implemented with other components of FIG. 1 according to some embodiments of the present disclosure.

FIG. 2 illustrates a plan view of an example of a midplane board 103-2. The midplane board 103-2 is an example of the midplane board 103 from FIG. 1. For example, the view in FIG. 2 may correspond to a side or top view of the midplane board 103-2 (e.g., depending on the installation orientation selected) and may contrast with what may be considered an end view in FIG. 1. However, the midplane board 103-2 is not the only possibility for the midplane board 103 from FIG. 1. For this reason, in FIG. 2, the elements of the midplane board 103-2 are identified by reference numbers that have the suffix "-2" appended.

The midplane board 103-2 is depicted in FIG. 2 with various interconnect portions 119 and adaptor portions 126, some of which are shown (in solid line) on a first side 121-2 (e.g., perhaps a top or left side) of the midplane board 103-2, and some of which are shown (in hidden line) on an opposite, second side 123-2 (e.g., perhaps a bottom or right side) of the midplane board 103-2.

Respective connectors on the midplane board 103-2 can be linked and/or otherwise communicatively coupled to one another to enable communication therebetween. In some embodiments, this may be accomplished by traces 122-2 and/or 132-2 included in the midplane board 103-2.

For example, in FIG. 2, the first interconnect portion 119A-2 is shown connected to traces 122-2 that will be named herein according to which end destination is reached thereby from the first interconnect portion 119A-2. (Hence, the set of traces 122-2 described for FIG. 2 will not include a "first trace" but will instead begin with a second trace 122B-2 that reaches the second interconnect portion 119B-2.) The first interconnect portion 119A-2 may be connected to either or both sides of the midplane board 103-2. For example, the first interconnect portion 119A-2 (e.g., on the first side 121-2) is shown connected to the second interconnect portion 119B-2 (e.g., on the opposite, second side 123-2) by the second trace 122B-2, connected to the third interconnect portion 119C-2 (e.g., back on the first side 121-2) by a third trace 122C-2, and connected to the fourth interconnect portion 119D-2 (e.g., again on the second side 123-2) by a fourth trace 122D-2. This may facilitate direct connection among the first interconnect portion 119A-2, second interconnect portion 119B-2, third interconnect portion 119C-2, and fourth interconnect portion 119D-2, e.g., to enable a four-node mesh network topology among four corresponding connected nodes.

However, the midplane 103-2 is not limited to such four-node functionality just described, and other numbers and/or topologies can be implemented. For example, in FIG. 2, the first interconnect portion 119A-2 can further be connected to some arbitrary number (e.g., M or N), such as to further interconnect portions 119M-2 and/or 119N-2 by respective traces 122M-2 and/or 122N-2. Additionally, in some embodiments, the first interconnect portion 119A-2 may be instead connected indirectly, such as by multi-hop rather than direct connection.

FIG. 2 also shows an example of possible interconnection for another type of connector. For example, at left in FIG. 2, a first adaptor portion 126A-2 is connected to a second adaptor portion 126B-2 by a second trace 132B-2, connected to a third adaptor portion 126C-2 by a third trace 132C-2, connected to a fourth adaptor portion 126D-2 by a fourth trace 132D-2, and so on up through being connected to arbitrary numbered adaptor portions 126M-2 and/or 126N-2 by respective traces 132M-2 and/or 132N-2. Similar to as noted above regarding the first interconnect portion 119A-2, the first adaptor portion 126A-1 can additionally or alternatively be connected to other numbers and/or by other topologies (e.g., which may include multi-hop or direct/single-hop connections).

Figure 3:
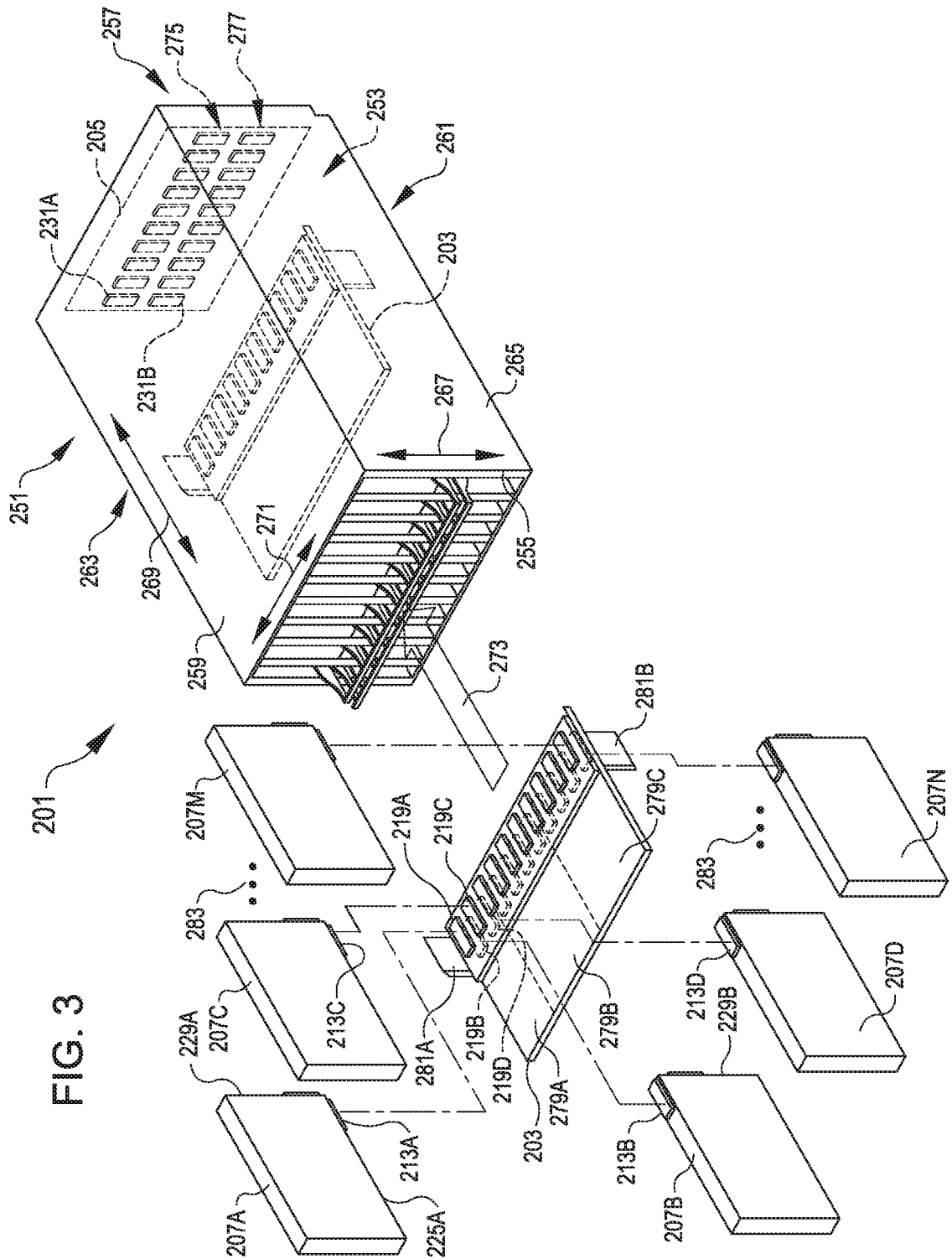
FIG. 3 illustrates one example of an implementation of components of FIG. 1 relative to a server rack chassis according to some embodiments of the present disclosure.

FIG. 3 illustrates a system 201 implemented relative to a chassis 251. Beyond the chassis 251, the system 201 in FIG. 3 further includes a midplane board 203, a power harness 205, and various compute sleds 207. These components may be examples of like-identified components from FIG. 1 and/or FIG. 2.

In use, the midplane board 203 and the power harness 205 may be wholly or at least partially received within the chassis 251, for example, as indicated in phantom lines in FIG. 3. In FIG. 3, the power harness 205 is depicted as a series of power connectors 231 mounted to a panel, although any other suitable structure can be utilized to adequately position the power connectors 231. FIG. 3 also shows the midplane board 203 in solid lines outside of the chassis 251 for ease of viewing relationships between the midplane board 203 and the compute sleds 207.

The chassis 251 can be sized to fit within a server rack. For example, the chassis 251 may be sized to have a width corresponding to a standard 19-inch or 23-inch rack frame, although other widths may alternatively be utilized. In some embodiments, the chassis 251 has a height that may be expressed in terms of a number of U, e.g., based on a multiple of 1.75 inches consistent with usage in the industry relating to server racks. In an illustrative example, the chassis 251 may be 9U in height (e.g., approximately 15.75 inches) and may accommodate compute sleds 207 that are "one-third width" (e.g., approximately 7.67 inches, as one third the standard 23 inch frame) and that are arranged in respective rows above and below the midplane board 203. However, other relative sizes of compute sleds 207 and chassis 251 can also be utilized.

The chassis 251 can define a space 253 bounded by a front 255, a rear 257, a top 259, a bottom 261, a left side 263, and a right side 265. Directions may be defined relative to the space 253. For example, a vertical direction 267 may be defined between the top 259 and the bottom 261. A longitudinal direction 269 may be defined between the front 255 and the rear 257. A lateral direction 271 may be defined between the left side 263 and the right side 265.

In FIG. 3, the midplane board 203 is shown arranged horizontally relative to the chassis 251. For example, as shown in phantom lines in FIG. 3, the midplane board 203 may extend within the chassis 251 in both the longitudinal direction 269 and the lateral direction 271. However, in some embodiments, the midplane board 203 may instead be arranged vertically relative to the chassis 251 (e.g., rotated 90 degrees from the depicted orientation and similar to the arrangement shown in FIG. 4 below) or at another orientation.

In FIG. 3, the midplane board 203 is shown having risers 281A and 281B. Any riser 281 included may provide structure to support and/or orient the midplane board 203 within the chassis 251. Additionally or alternatively, any riser 281 included may include components to facilitate communication between sleds 207 received by the midplane board 203 and other components elsewhere in or remote from the chassis 251 and/or communication among the received sleds 207.

The midplane board 203 can receive any suitable number of sleds 207 and provide communication therebetween. For example, the midplane board 203 is shown in FIG. 3 configured to receive ten sleds 207 on a top side and ten other sleds 207 on a bottom side, and may provide connection between all such sleds 207, e.g., to provide a mesh network. However, the midplane board 203 is not so limited. In some embodiments, the midplane board 203 may connect received sleds 207 to less than all other sleds. For example, the midplane board 203 in FIG. 3 is depicted with different sections 279A, 279B, and 279C. The respective sleds 207 in each section 279 may be connected via the midplane board 203 for inter-processor communication to other sleds 207 within that section. For example, the first section 279A may include four sleds 207 interconnected to each other, e.g., for four-way inter-processor communication. The second section 279B and the third section 279C may each be examples of arrangements that may receive eight sleds 207 (e.g., four on top and four on bottom), such as for eight-way inter-processor communication. In some embodiments, the respective sections 279 may be in communication with each other, e.g., through the midplane board 203. Overall, the different interconnect portions 219 of the midplane board 203 may be connected or not connected to each other in any desired manner to accomplish a particular topology. Additionally or alternatively, the midplane board 203 and/or sleds 207 may include other forms of connectors. For example, although respective adaptor connectors such as those identified by reference numbers including 124 and 126 in FIGS. 1 and 2 are absent from FIG. 3 to avoid cluttering the view, such elements or others could also be implemented or included with respect to elements described and shown with respect to FIG. 3.

The midplane board 203 is also not limited to the depicted arrangement configured to receive ten sleds 207 on a top side and ten other sleds 207 on a bottom side. Compatibility for other numbers or types of sleds 207 may be implemented. In an illustrative example, the sections 279B and 279C of the depicted midplane board 203 could be omitted, e.g., such that only functionality for receiving four sleds 207 is provided. As an alternative, the sections 279A and 279C of the depicted midplane board 203 could be omitted, e.g., such that only functionality for receiving eight sleds 207 is provided. Although four-way and eight-way inter-processor communication may be particularly suitable for many network applications, other numbers may be utilized. More generally, FIG. 3 includes ellipses 283 leading up to generically identified sleds 207M and 207N (in which M or N could represent any number) to re-iterate graphically that any suitable number of sleds may be utilized and the midplane board 203 modified to match accordingly.

In use, for installation, the compute sleds 207 may be introduced through the front 255 of the chassis 251, such as illustrated by arrow 273. This may include translating the compute sleds 207 in the longitudinal direction 269 (e.g., which may be an example of the motion illustrated by arrow 141 in FIG. 1). Such motion may cause engagement of rear ends 229 of the sleds 207 with power connectors 231 on the power harness 205. For example, a rear end 229A of a first compute sled 207A positioned above the midplane board 203 may engage a first power connector 231A in an upper row 275 situated above the midplane board 203, while a rear end 229B of a second compute sled 207B positioned below the midplane board 203 may engage a second power connector 231B in a lower row 277 situated below the midplane board 203.

Installing the compute sleds 207 may also involve translating toward the midplane board 203 and non-parallel to the longitudinal direction 269. For example, in FIG. 3, the sleds 207 may be translated in the vertical direction 267 to cause engagement between the sleds 207 and the midplane board 203 (e.g., which may be an example of the motion illustrated by arrow 145 in FIG. 1). As illustrative examples, a first sled 207A may be translated downward to cause engagement between its interconnect part 213A and the first interconnect portion 219A on the midplane board 203, while a second sled 207B may be translated upward to cause engagement between its interconnect part 213B and the second interconnect portion 219B on the midplane board 203. Similarly, a third sled 207C may be translated downward to cause engagement between its interconnect part 213A and the third interconnect portion 219C on the midplane board 203, while a fourth sled 207D may be translated upward to cause engagement between its interconnect part 213D and the fourth interconnect portion 219D on the midplane board 203. Such a pattern may continue through a final pair of sleds 207M and 207N, if present.

FIG. 4 illustrates a system 301 implemented relative to a chassis 351. The chassis 351 may be similar to the chassis 251 described above with respect to FIG. 3, and as such, related description will not be repeated. Similarly, components discussed with respect to FIG. 4 may be examples of like-identified components from FIG. 1, FIG. 2 and/or FIG. 3. Moreover, further examples of the power harness and adaptor connectors discussed above are absent from FIG. 4 for the sake of simplicity of the view, but nevertheless may be present in implementation.

In some embodiments, a midplane board 303 may be arranged vertically relative to the chassis 351. For example, as shown in phantom lines in FIG. 4, the midplane board 303A extends within the chassis 351 in both the longitudinal direction 369 and the vertical direction 367.

In use, for installation, the compute sleds 307 may be introduced through the front 355 of the chassis 351, such as illustrated by arrows 373. This may include translating the compute sleds 307 in the longitudinal direction 369 (e.g., which may be an example of the motion illustrated by arrow 141 in FIG. 1). Such motion may cause engagement of rear ends of the sleds 307 for power connection, e.g., similar to as described in FIGS. 1, 2 and/or 3. For example, a sled 307 introduced to the left of the midplane board 303 may engage for power in a row to the left and behind the midplane board 303, while a sled introduced to the right of the midplane board 303 may engage for power in a row to the right and behind the midplane board 303.

Installing the compute sleds 307 may also involve translating toward the midplane board 303 and non-parallel to the longitudinal direction 369. For example, in FIG. 4, the sleds 307 may be translated in the lateral direction 371 to cause engagement between the sleds 307 and the midplane board 303 (e.g., which may be an example of the motion illustrated by arrow 145 in FIG. 1). As illustrative examples, one sled 307A positioned to the left of the midplane board 303 may be translated rightward to cause engagement between its interconnect part 313A and a first interconnect portion 319A on the midplane board 303, while another sled 307M positioned to the right of the midplane board 303 may be translated leftward to cause engagement between its interconnect part 313M and another interconnect portion 319M on the midplane board 303.

In FIG. 4, the chassis 351 is shown receiving two midplane boards 303A and 303B. The multiple received midplane boards 303A and 303B may be offset in different planes, e.g., parallel to each other. Although the midplane boards 303A and 303B are shown in a vertical orientation relative to the chassis 351, arrangements with such multiples are not limited to vertical orientation. For example, with a variation in sizing from the relative dimensions depicted in FIG. 3, multiple midplane boards 203 could additionally or alternatively be arranged with a horizontal orientation relative to the chassis 251. Moreover, although implementing a different orientation (e.g., vertical instead of horizontal or vice versa) may reduce a number of sleds that would fit on a midplane board in a given chassis in some embodiments (e.g., such as the midplane boards 303 in FIG. 4 each exhibiting seven berths per side for receiving sleds 307 compared to the midplane boards 203 in FIG. 3 each exhibiting ten berths per side), nevertheless implementing a different orientation may allow for multiple midplane boards to be fit within the space to net a larger net number of accommodated sleds (e.g., such as the chassis 351 in FIG. 4 being shown with berths to accommodate twenty-eight total sleds 307, while the chassis 251 in FIG. 3 is shown with berths to accommodate twenty total sleds 207). Additionally, although arrangements herein are depicted with exclusively one orientation, in some embodiments, a chassis could include at least one midplane board arranged in one orientation (e.g., horizontal) and at least one midplane board arranged in another orientation (e.g., vertical).

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
a chassis sized to fit in a server rack, the chassis defining a space bounded by a front, a rear, a top, a bottom, a left side, and a right side, the chassis further defining a vertical direction between the top and the bottom, a longitudinal direction between the front and the rear, and a lateral direction between the left side and the right side;
a power harness extending in the vertical direction and comprising a first power connector, a second power connector, a third power connector, and a fourth power connector, wherein at least the first power connector is configured to receive in the longitudinal direction to establish connection for transmission of power and to permit translation therein substantially perpendicular to the longitudinal direction;
a midplane board extending in the longitudinal direction and comprising a first interconnect slot and a second interconnect slot on one side of the midplane board and a third interconnect slot and a fourth interconnect slot on an opposite side of the midplane board; and
a set of sleds each respectively comprising a rear edge, a lateral edge, a processor, and a connector positioned at the lateral edge and coupled with the processor, the set of sleds comprising:
a first sled having a first connector received in the first interconnect slot of the midplane board and coupled at a first rear edge to the first power connector of the power harness;
a second sled having a second connector received in the second interconnect slot of the midplane board and coupled at a second rear edge to the second power connector of the power harness;
a third sled having a third connector received in the third interconnect slot of the midplane board and coupled at a third rear edge to the third power connector of the power harness; and
a fourth sled having a fourth connector received in the fourth interconnect slot of the midplane board and coupled at a fourth rear edge to the fourth power connector of the power harness;
wherein the first, second, third, and fourth interconnect slots of the midplane board are electrically coupled to one another to form a mesh network among the processors of the set of sleds.

2. The system of claim 1, wherein each sled of the set of sleds further comprises a topology link connecting the processor to the connector, wherein the topology link is less than six inches in length.

3. The system of claim 1, wherein each connector comprises an Ultra Path Interconnect (UPI) interface or a Peripheral Component Interconnect Express (PCIE) interface.

4. The system of claim 1, wherein each sled comprises two connectors configured to engage the midplane board, wherein a first of the two connectors is coupled with the sled's processor, and wherein a second of the two connectors is coupled with a component other than the sled's processor.

5. The system of claim 4, wherein one sled's processor is connected to another sled's component, other than the other sled's processor, via a connection provided by the midplane board.

6. A system, comprising:
a midplane board;
a first sled comprising a first processor and a first interconnect part, the first interconnect part being coupled with the first processor, disposed on a lateral edge of the first sled, and received by a first interconnect portion disposed on one side of the midplane board;
a second sled comprising a second processor and a second interconnect part, the second interconnect part being coupled with the second processor, disposed on a lateral edge of the second sled, and received by a second interconnect portion disposed on the one side of the midplane board;
a third sled comprising a third processor and a third interconnect part, the third interconnect part being coupled with the third processor, disposed on a lateral edge of the third sled, and received by a third interconnect portion disposed on an other side of the midplane board;
a fourth sled comprising a fourth processor and a fourth interconnect part, the fourth interconnect part being coupled with the fourth processor, disposed on a lateral edge of the fourth sled, and received by a fourth interconnect portion disposed on the other side of the midplane board; and
a power harness comprising respective power connectors configured to be connected to respective rear edges of the first sled, second sled, third sled, and fourth sled, wherein at least one of the power connectors is configured to receive in a longitudinal direction to establish connection for transmission of power and to permit translation therein substantially perpendicular to the longitudinal direction;
wherein the first, second, third, and fourth interconnect portions of the midplane board are connected so as to enable inter-processor communication among the first, second, third, and fourth processors.

7. The system of claim 6, wherein the midplane board is configured to receive at least eight sleds and enable inter-processor communication among processors of the at least eight sleds.

8. The system of claim 6, wherein the first sled, the second sled, the third sled, and the fourth sled are replicas of each other.

9. The system of claim 8, wherein the first sled on the one side of the midplane board is arranged in an orientation that is flipped 180 degrees from an orientation of the replica third sled on the other side of the midplane board.

10. The system of claim 6, wherein the midplane board comprises a first midplane board, the first midplane board is in a server rack chassis, and the system further comprises:
a second midplane board in the server rack chassis; and
two additional sleds coupled with one side of the second midplane board and two additional sleds coupled with an other side of the second midplane board, wherein the second midplane board comprises connections to enable inter-processor communication among processors within the sleds coupled with the second midplane board.

11. The system of claim 6, further comprising:
a server rack chassis containing the midplane board.

12. The system of claim 6, wherein the first sled, second sled, third sled, and fourth sled are configured to be installed by a first motion for connecting to power by moving in a longitudinal direction of a server rack chassis containing the midplane board, and by a second motion for connecting for data transfer by translating toward the midplane board and non-parallel to the longitudinal direction.

13. The system of claim 6, wherein the first interconnect part and the first interconnect portion comprise respective components configured for an Ultra Path Interconnect (UPI) interface.

14. The system of claim 6, wherein the first interconnect part and the first interconnect portion comprise respective components configured for a Peripheral Component Interconnect Express (PCIE) interface.

15. A method comprising:
engaging a first rear end of a first sled with a first power connector within a server rack chassis by translating the first sled in a longitudinal direction of the server rack chassis; and
subsequent to the engaging of the first rear end of the first sled with the first power connector, engaging a first interconnect part on a first lateral edge of the first sled with a first interconnect portion on one side of a midplane board within the server rack chassis by translating the first sled toward the midplane board and non-parallel to the longitudinal direction.

16. The method of claim 15, further comprising: connecting a first processor on the first sled for inter-processor communication by engaging a second sled, a third sled, and a fourth sled to the midplane board so that a second processor on the second sled, a third processor on the third sled, and a fourth processor on the fourth sled are connected via the midplane board to the first processor for inter-processor communication.

17. The method of claim 15, wherein the translating the first sled toward the midplane board comprises translating the first sled in a lateral direction.

18. The method of claim 16, wherein the midplane board is configured to extend longitudinally and vertically within a server rack chassis configured to contain the midplane board;
wherein the translating the first sled toward the midplane board comprises translating the first sled in a particular direction; and
wherein engaging the second sled to the midplane board comprises translating the second sled in a direction opposite of the particular direction.

19. The method of claim 15, wherein the translating the first sled toward the midplane board comprises translating the first sled in a vertical direction.

20. The method of claim 16, wherein the midplane board is configured to extend longitudinally and horizontally within a server rack chassis configured to contain the midplane board;
wherein the translating the first sled toward the midplane board comprises translating the first sled in an upward direction; and
wherein engaging the second sled to the midplane board comprises translating the second sled in a downward direction.

* * * * *